(12) United States Patent
Ginetti et al.

(10) Patent No.: US 9,092,586 B1
(45) Date of Patent: Jul. 28, 2015

(54) VERSION MANAGEMENT MECHANISM FOR FLUID GUARD RING PCELLS

(71) Applicant: CADENCE DESIGN SYSTEMS, INC., San Jose, CA (US)

(72) Inventors: Arnold Jean-Marie Gustave Ginetti, Antibes (FR); Jean-Noel Pic, Valbonne (FR); Manav Khanna, Chandigarh (IN); Reenee Tayal, Delhi (IN); Mayank Sharma, Agra (IN); Gerard Tarroux, Villeneuve-Loubet (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/292,661

(22) Filed: May 30, 2014

(51) Int. Cl.
G06F 17/50 (2006.01)
(52) U.S. Cl.
CPC .................................. *G06F 17/5045* (2013.01)
(58) Field of Classification Search
CPC ................................. G06F 17/50; G06F 9/455
USPC .......................................................... 716/102
See application file for complete search history.

(56) References Cited

U.S. PATENT DOCUMENTS 7,293,247 B1    11/2007  Newton et al.
8,719,745 B2 *   5/2014  Ting et al. ..................... 716/111

OTHER PUBLICATIONS

Rich Morse, Technical Marketing and EDA Alliances Manager for Physical Design Product Group SpringSoft Inc.; Circuit Design, "Solving the disappearing PCell mystery"; EE Times—India, eetindia.com; Dec. 20, 2010, 5 pages.

* cited by examiner

*Primary Examiner* — Thuan Do
(74) *Attorney, Agent, or Firm* — Kenyon & Kenyon LLP

(57) ABSTRACT

A version management system for fluid guard ring (FGR) PCells uses one or more new version management parameters that are added to the FGR PCell definition to manage the source code versions for a PCell. The system saves instance layout information with a version management parameter that identifies the current PCell source code version for each FGR PCell instance. When evaluated using a newer version of the PCell source code, the instance layout information generated with a previous version of PCell source code can be retrieved. The retrieved layout information will be used during evaluation of the PCell to ensure the integrity of the PCell geometries that were previously verified. The saved layout information will be uniquely identifiable with a hash code of the name-value pairs for one or more parameters associated with the PCell instance.

19 Claims, 6 Drawing Sheets

100

200

300

400

500

600

710

VERSION MANAGEMENT MECHANISM FOR FLUID GUARD RING PCELLS

BACKGROUND

Aspects of the present invention relate generally to the field of integrated circuit design, and more specifically to version management for Fluid Guard Ring PCells implemented in a design.

Integrated circuit (IC) design is increasingly complex, sometimes involving millions of elements, shapes or geometries, and may be facilitated with an electronic design automation (EDA) tool that allows a designer to interactively position ("place") and connect ("route") various shapes on the circuit. As part of the process of physical design, the EDA tool creates a circuit layout containing the physical locations and dimensions of the circuit's components, interconnections, and various layers from the original design that may then be fabricated, creating the IC. The designed IC is eventually fabricated by transferring or printing the circuit layout to a semiconductor substrate in a series of layers that collectively will form the features that constitute the devices that make up the components of the integrated circuit.

During the process of physical design of the IC, guard rings are often added to enclose one or more devices (e.g. transistors) in the layout. The added guard rings protect the enclosed device(s), for example against a latchup problem or from external noise. In some systems, the added guard rings are implemented in the EDA tool as fluid PCells. PCells that provide advanced creation and editing capabilities to the IC designer may be considered fluid PCells. More specifically, fluid guard rings are PCell devices that include the PCell formal parameters as well as Component Description Format (CDF) parameters. A fluid guard ring PCell device definition will be stored and accessible through the technology file of the design library.

However, certain updates or changes to fluid guard ring source code in the EDA tool, including updates, new feature support and bug fixes, can alter the footprint of an instance of a fluid guard ring PCell in a design. For example, when evaluating or testing the design using different source code releases, the geometry of the fluid guard ring can change. Then a design that was previously tested and qualified with an earlier version of the source code may need to be retested and re-qualified under the new release. Because of this uncertainty, IC designers often avoid updating the fluid guard ring source code to the newest release of the EDA tool.

Accordingly, there is a need in the art for a system that preserves the geometries of fluid PCells across different code versions.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

A version management system for fluid guard ring PCells will save the sub-master of each fluid guard ring PCell instance of the design in the form of a cellview in the design library. The saved cellview will contain the instance layout generated for that specific source code version. The name of the saved cellview will be a hash code that uniquely identifies the instance. When the instance is later opened or evaluated in an EDA tool that has a newer version of source code, each fluid guard ring PCell instance will be evaluated to identify whether a cellview created with a previous source code version was saved. If a cellview for the instance was previously saved, the cellview will be copied into the sub-master for the instance. As a result of this version management system, users will be able to utilize the full potential of any new features and bug fixes in latest source code without compromising a previously qualified design.

One or more new parameters are added to the PCell definition to manage the source code versions for a PCell. For example, the current code release version of the EDA tool and/or the name of the relevant technology library in which the PCell is defined may be sufficient to identify a current version of the fluid PCell source code. An updated PCell definition with the new parameters will be stored in memory storage or an associated technology database and will be available for use in the EDA tool. According to an aspect of an embodiment, the default value of the parameter may be set as the current value of the parameter, e.g., the version of the source code, at the time when the new PCell was first defined.

The modified PCell definition with one or more version management parameters, may be predefined in the EDA tool. Alternatively, the circuit designer may create a new definition of a fluid PCell and store the new definition in a local library for future use.

When an instance of the modified PCell is added to a design, the version management parameter may be populated. For example, if a PCell createVersion parameter is required for version management, the parameter will be set as the version that was last used to create or edit the PCell instance. The parameter is automatically populated upon creation or editing of a PCell and therefore does not require any user action.

According to an embodiment, the version management parameter will be visible and editable to the user. The user can also manually update the parameter to either zero or the current version of the PCell source code. Any other value will be considered invalid and the value of the version management parameter will be reset to the current version of the PCell source code.

Figure 1:
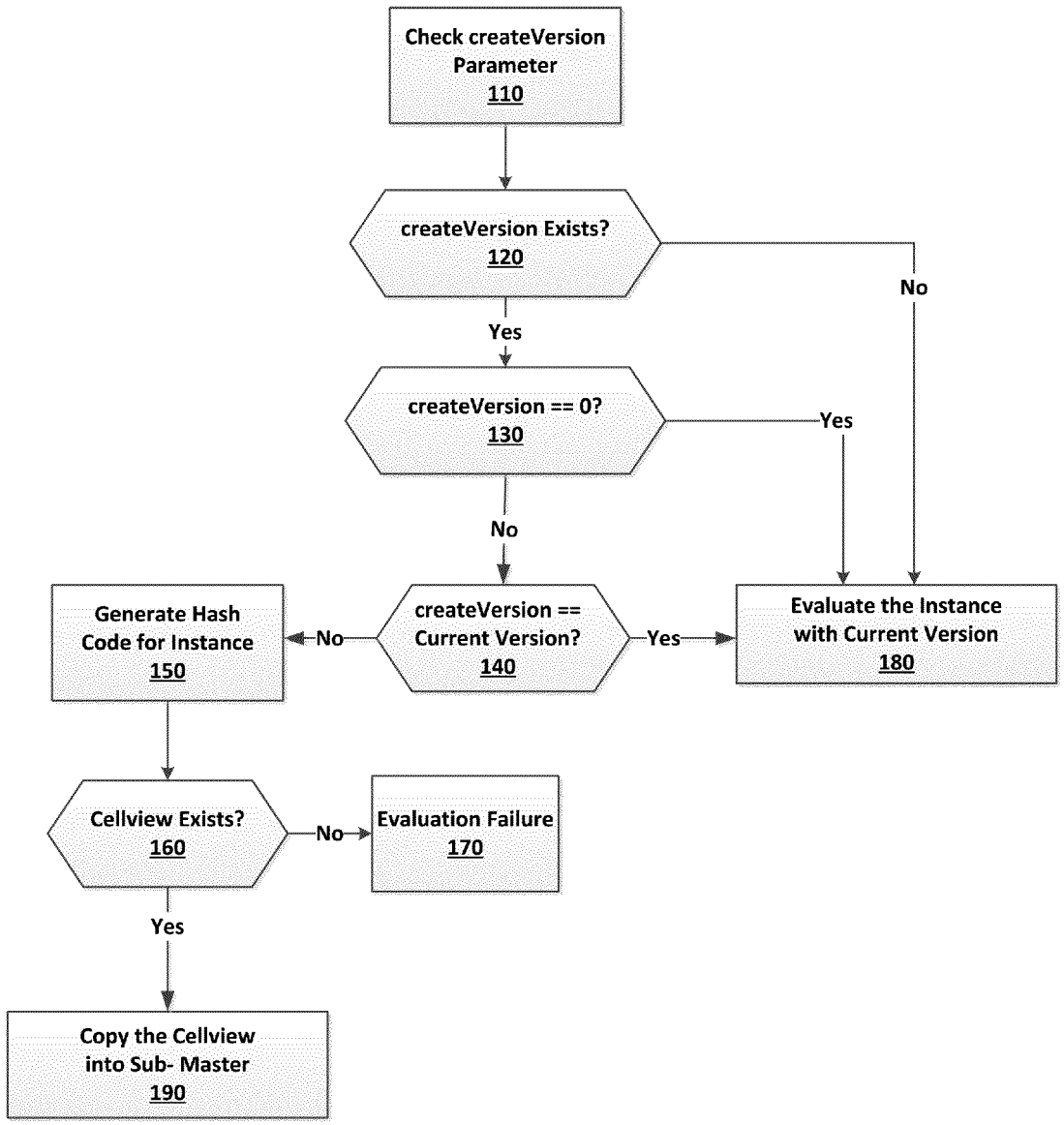
FIG. 1 is a flow diagram that illustrates an exemplary method for evaluating an instance of a PCell in a circuit design according to an embodiment of the present invention.

FIG. 1 is a flow diagram that illustrates an exemplary method 100 for evaluating an instance of a PCell in a circuit design according to an embodiment of the present invention. A PCell may be evaluated when the instance is created, when the instance is edited, and when a user command results in an evaluation. In FIG. 1, to evaluate a PCell, the EDA tool will first check the version management parameter (block 110). As shown in FIG. 1, the version management parameter is the createVersion parameter. Then, if the createVersion parameter does not exist (block 120), a warning message may be displayed that the guard ring PCell device or instance needs to be redefined (not shown). Additionally, when the createVersion parameter does not exist, the instance will be evaluated with the source code of the current version of the EDA tool in use (block 180).

If the createVersion parameter does exist (block 120), but if the createVersion parameter is equal to zero (block 130), the instance will be evaluated with the source code of the current version of the EDA tool in use (block 180). According to an aspect of an embodiment, to disable version management for a guard ring PCell, the createVersion parameter may be set to zero. Then that instance will always be re-evaluated with the current version of source code regardless of which PCell source code version was used to create or edit the instance. If the createVersion parameter is not equal to zero (block 130), and if the createVersion parameter is equal to the current version of source code (block 140), the instance will be evaluated with the source code of the current version of the EDA tool in use (block 180).

If the createVersion parameter is not equal to the current version of the source code, a hash code for the instance will be generated (block 150). The hash code may be generated from one or more parameters of the instance and is unique to the instance. The hash code can be used to identify a cellview for the instance stored in memory. If a cellview corresponding to the hash code does not exist in memory (block 160), then an error message is displayed indicating there was an error in evaluating the instance (block 170). However, if a cellview corresponding to the hash code is identified in memory (block 160), then the cellview is copied into the sub-master of the instance (block 190). Copying the cellview into the sub-master of the instance will restore the source code from the version with which the instance was saved, preserving the geometry of fluid guard ring PCell instance. Then the instance can be evaluated with the restored source code.

According to an embodiment, the hash code may be derived from a string that consists of a concatenation of all the formal parameters and their values for the PCell instance other than a parameter that designates the design library for the instance. This hash code will be unique to the PCell instance and may be used to name or otherwise identify the cellview associated with the instance.

Figure 2:
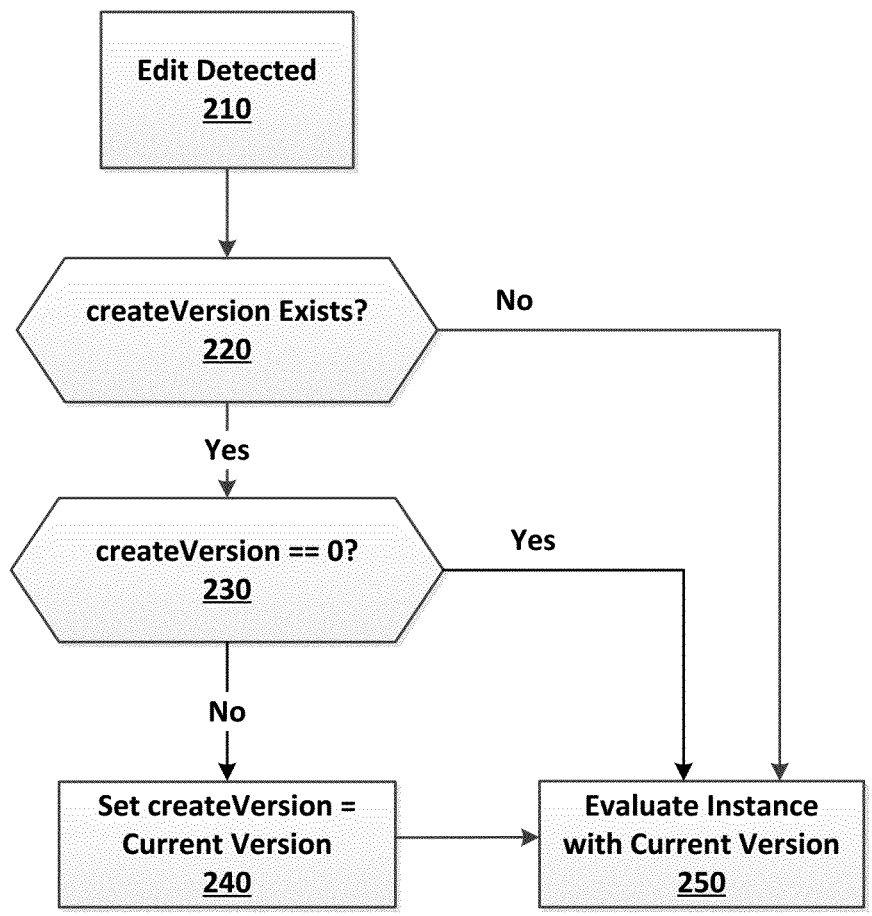
FIG. 2 is a flow diagram that illustrates an exemplary method for updating an instance of a PCell in a circuit design according to an embodiment of the present invention.

FIG. 2 is a flow diagram that illustrates an exemplary method 200 for updating an instance of a PCell in a circuit design according to an embodiment of the present invention. When an instance of a PCell is edited, the version management parameters are also edited to ensure that the PCell instance is evaluated using the current (editing) version of the PCell source code in future evaluations. Then the PCell instance is reevaluated.

As shown in FIG. 2, initially a PCell instance is edited (block 210). Editing may include using a command to alter the PCell, for example merge, clean, overlap, convert, chop, reshape, split, etc., or may include editing a parameter of the PCell instance. Other edits that alter the PCell instance are also contemplated.

Upon detecting an edit to a PCell instance (block 210), the EDA tool will first check whether a version management parameter exits (block 220). As shown in FIG. 2, the version management parameter is the createVersion parameter. Then, if the createVersion parameter does not exist (block 220), the instance will be evaluated with the source code of the current version of the EDA tool in use (block 250). If the createVersion parameter does exist (block 220), but if the createVersion parameter is equal to zero (block 230), then version management is disabled for the instance and the instance will be evaluated with the source code of the current version of the EDA tool in use (block 250). If the createVersion parameter is not equal to zero (block 230), the createVersion parameter will be set to the current version of the source code (block 240). Then the instance will be evaluated with the source code of the current version of the EDA tool in use (block 250).

Figure 3:
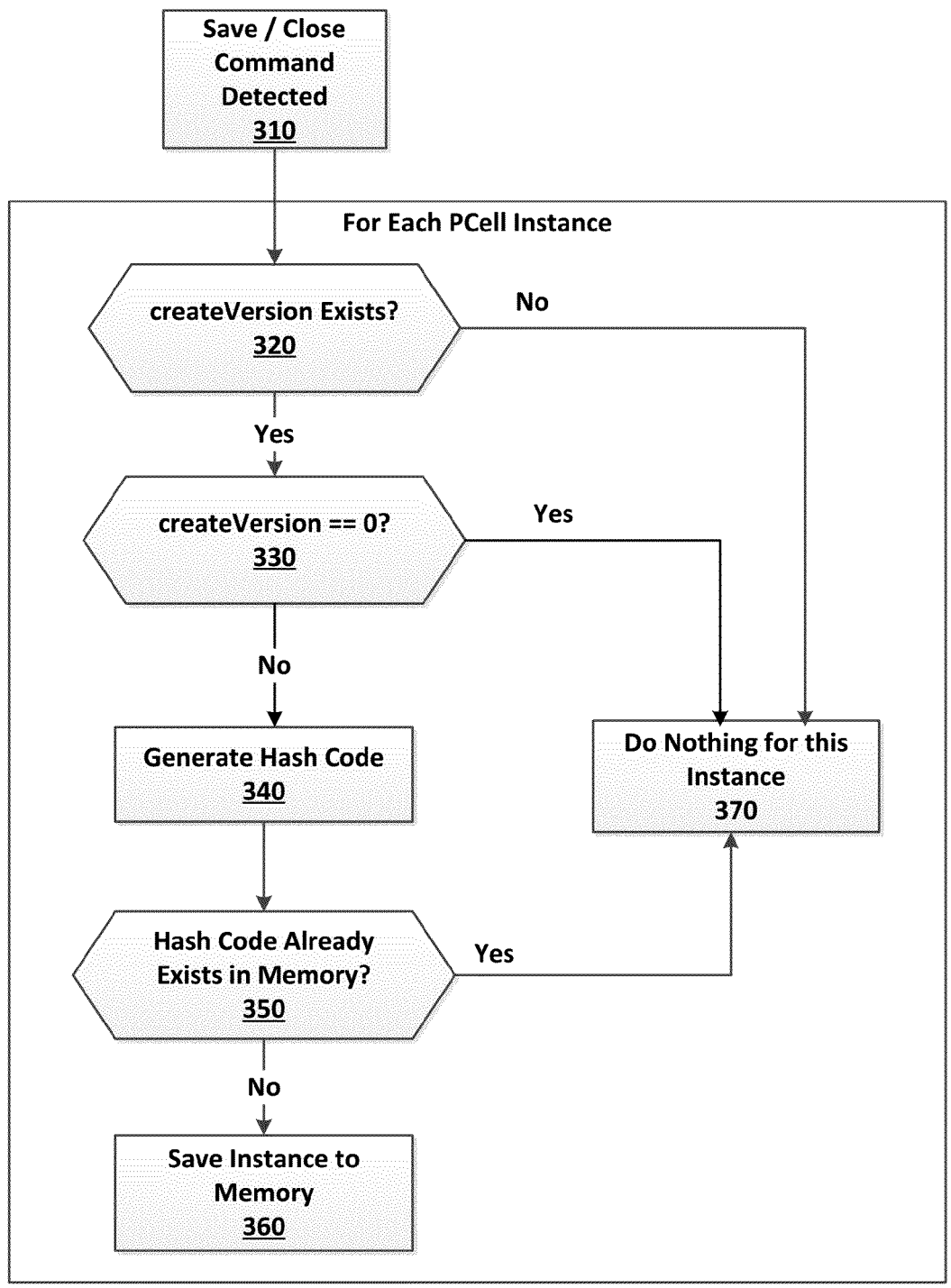
FIG. 3 is a flow diagram that illustrates an exemplary method for saving an updated version of an instance of a PCell in a circuit design according to an embodiment of the present invention.

FIG. 3 is a flow diagram that illustrates an exemplary method 300 for saving an updated version of an instance of a PCell in a circuit design according to an embodiment of the present invention. For designs containing one or more PCell instances with version management enabled, all PCell sub-masters will be stored in memory when the design is saved or closed. Stored sub-masters will then be available for later use during evaluation of the respective PCell.

Initially, upon detection of a save or close command (block 310), the EDA tool will iterate through and analyze each PCell instance in the design. For each PCell instance in the design, if the createVersion version management parameter exits (block 320), and if the createVersion parameter is not equal to zero (block 330), then a hash code for the instance will be generated (block 340). However, if the createVersion parameter does not exist for an instance (block 320), or if the createVersion parameter is set to zero for an instance (block 330), then nothing need be done for the current instance (block 370) and the EDA tool will analyze the next instance in the design.

Once a hash code for an instance has been generated, the EDA tool will determine whether the hash code already exists in memory (block 350). If the hash code for the current instance already exists in memory, then the sub-master for the instance has already been stored and nothing else need be done for the current instance (block 370). However, if the hash code does not already exist in memory, the sub-master for the instance will be saved to memory with the generated hash code (block 360).

According to an aspect of an embodiment, a sub-master of a PCell instance may be saved to memory in the following format:

<designLib>/zzz_<Device_SuperMaster_
      Name9<hashCode>'

Where the designLib is the current library for the design and the hashCode uniquely identifies an instance of the PCell.

Figure 4:
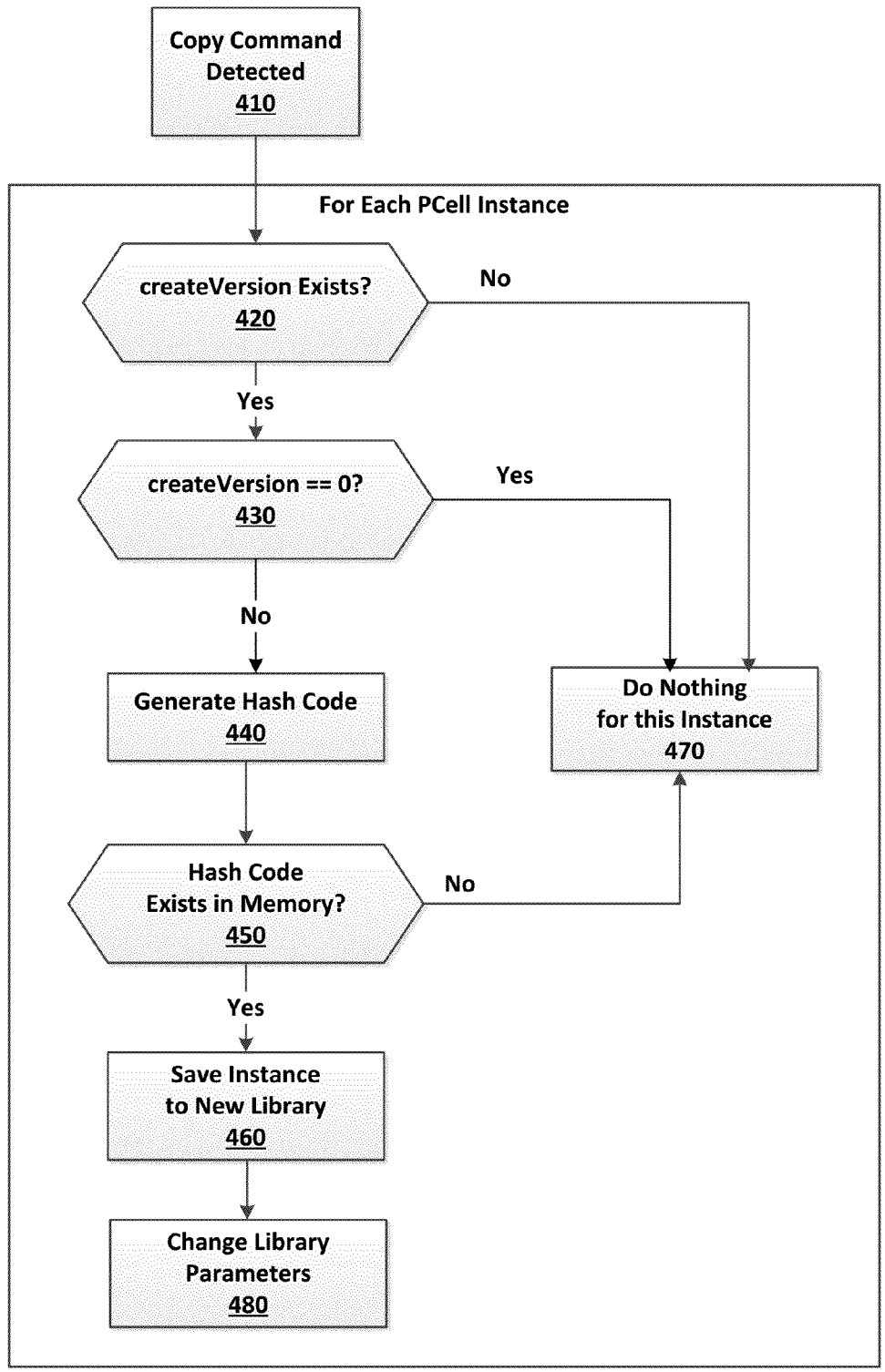
FIG. 4 is a flow diagram that illustrates an exemplary method 400 for copying a design to another design library according to an embodiment of the present invention.

FIG. 4 is a flow diagram that illustrates an exemplary method 400 for copying a design to another design library according to an embodiment of the present invention. For designs containing one or more PCell instances with version management enabled, when the design is copied to new library, all sub-masters for the PCell instances will be stored in memory with the new library. Stored sub-masters will then be available for later use during evaluation of the respective PCells with the new library.

Initially, upon detection of a copy command (block 410), the EDA tool will iterate through and analyze each PCell instance in the design. For each PCell instance in the design, if the createVersion version management parameter exits (block 420), and if the createVersion parameter is not equal to zero (block 430), then a hash code for the instance will be generated (block 440). However, if the createVersion parameter does not exist for an instance (block 420), or if the createVersion parameter is set to zero for an instance (block 430), then nothing need be done for the current instance (block 470) and the EDA tool will analyze the next instance in the design.

Once a hash code for an instance has been generated, the EDA tool will determine whether the hash code already exists in memory (block 450). If the hash code for the current instance already exists in memory, then the sub-master for the instance will be copied and saved to the new design library (block 460). However, if the hash code does not already exist in memory, nothing else need be done for the current instance (block 470). For each sub-master copied to the new library, any parameters that relate to or point to the design library will be updated with respect to the new library (block 480). Such parameters may include a design library parameter with a value set to the library in which the PCell was created or edited.

According to an aspect of an embodiment, to edits the design library parameter for all PCells copied to the new library, the EDA tool may iterate through all saved PCells and change the parameter value as necessary.

Figure 5:
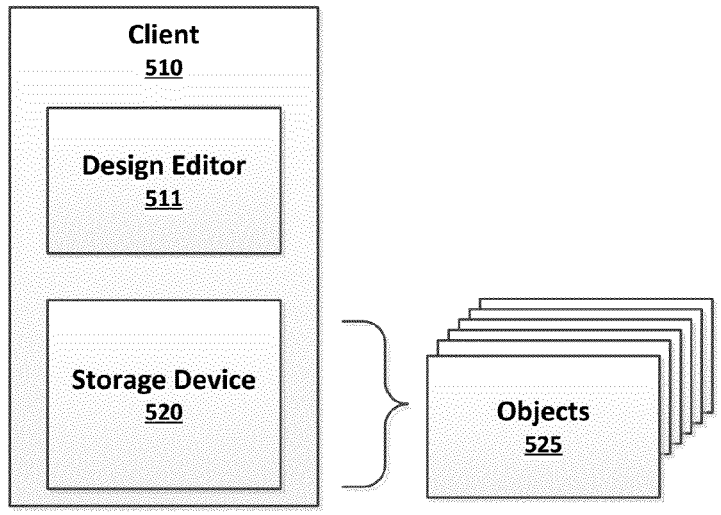
FIG. 5 is a simple block diagram illustrating components of an exemplary system according to an embodiment of the present invention.

A user may access an EDA tool to edit version controlled fluid PCells in a standalone client system, client-server environment, or a networked environment. FIG. 5 is a simple block diagram illustrating components of an exemplary system 500 according to an embodiment of the present invention. As shown in FIG. 5, a system 500 may comprise a client 510 executing a design editor 511 and having a memory storage 520. The client 510 may be any computing system that executes a design editor 511 or otherwise facilitates access to memory storage 520, for example a personal computer. The client 510 may include a processor that performs a method in accordance with the disclosed embodiments. Such a client would be part of an overall design system in accordance with the disclosed embodiments.

Hardware designs and models, instruction sets, software packages, instances of the components, state information for the components, and other objects 525 used by the design editor 511 may be stored in memory storage 520. A user may access the objects 525 stored in memory storage 520 with the client 510 via the design editor 511, where the design editor 511 is capable of accessing memory storage 520 and displaying the objects 525 and the data associated with the design. The design editor 511 may include a user interface, for example a program, application or middleware that acts as a frontend to and facilitates access to objects in memory storage 520. The user may interact with the design editor 511 through a number of input devices, such as by inputting a selection as with a mouse or inputting a request as with a keyboard. The user may observe the design on an output device or display. The design editor 511 may run in an application window controlled by the user.

As shown in FIG. 5, a client 510 may be a stand-alone system, as may be of particular interest where the components being simulated are highly confidential. Additionally, according to an aspect of an embodiment as shown in FIG. 6, a client 610 may be part of a networked environment.

Figure 6:
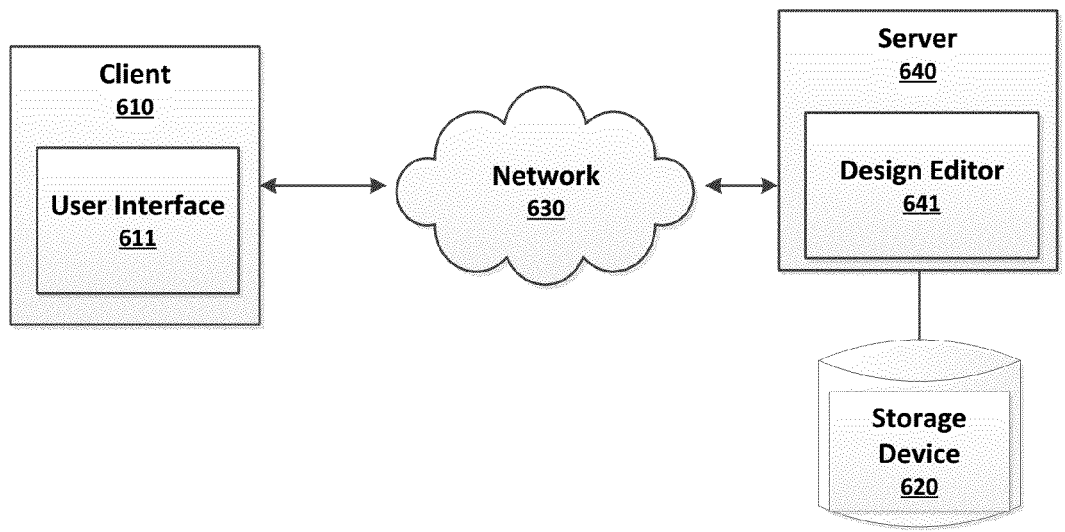
FIG. 6 is a simple block diagram illustrating components of an exemplary system according to an embodiment of the present invention.

FIG. 6 is a simple block diagram illustrating components of an exemplary system 600 according to an embodiment. As shown in FIG. 6, system 600 may include a client 610 having a user interface 611. The client 610 may be connected to a server 640 via a network 650. The design editor 641, which in this embodiment is located at server 640, may have access to storage device 620 storing hardware designs and models, instruction sets, software packages, instances of the components, state information for the components, and other objects utilized by the design editor 641. The server 640 may include a processor that performs a method in accordance with the disclosed embodiments. Such a server then would be part of an overall design system in accordance with the disclosed embodiments.

A user may access a design editor 641 at the server 640 via the client 610 having a user interface 611 capable of accessing and displaying the design components. The client 610 may be any computing system that facilitates the user accessing storage device 620, for example a personal computer. The network 650 may be a wired or wireless network that may include a local area network (LAN), a wireless network, the Internet, or any other network available for accessing storage device 620 from the client 610.

The server 640 may be a network server accessible to the client 610 via the network 650 that may manage access to storage device 620. The user interface 611 may receive instructions regarding a design from the user and utilizing the objects stored in memory storage 620, facilitate a display of the design. Multiple different clients (not shown) may access storage device 620 via the network 630 and request access to the objects stored therein.

In another networked environment, the simulator may be executed on a network capable client and will access the designs, packages and other objects stored in one or more storage devices via a network and communications server.

Figure 7:
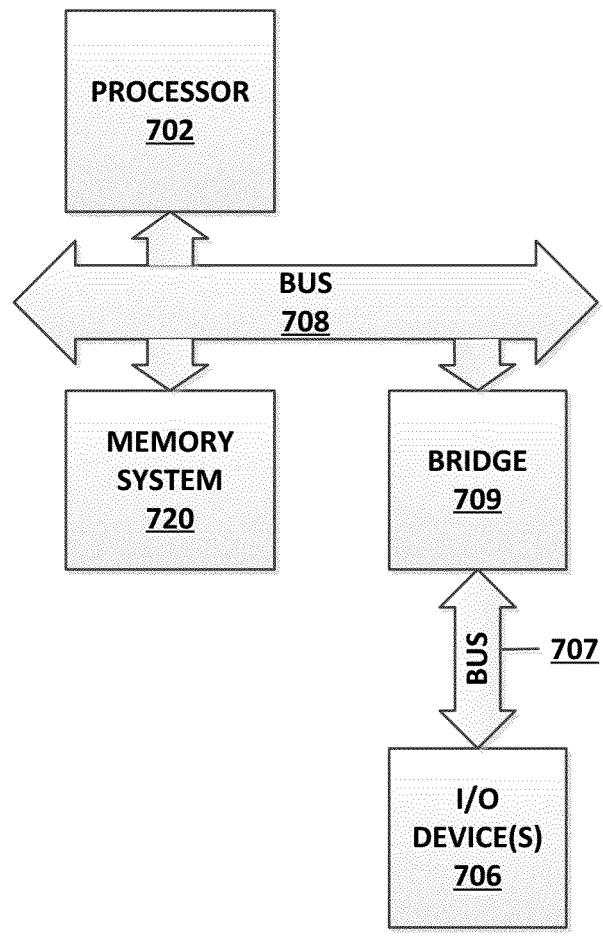
FIG. 7 is a simple block diagram illustrating components of an exemplary client according to an embodiment of the present invention.

FIG. 7 is a simple block diagram illustrating components of an exemplary client 710 according to an embodiment of the present invention. As shown in FIG. 7, the client 710 configured to execute the simulator as described herein may include a processor 702, a memory system 720 and one or more input/output (I/O) devices 706 in communication. The communication can be implemented in a variety of ways and may include one or more computer buses 707, 708 and/or bridge devices 709 as shown in FIG. 7. The I/O devices 706 can include network adapters and/or mass storage devices from which the client 710 can receive commands for executing the simulation.

As shown in FIG. 5, a client 710 may be a stand-alone system, as may be of particular interest where the components being simulated are highly confidential. Additionally, according to an aspect of an embodiment as shown in FIG. 6, a client 710 may be part of a networked environment.

Although described primarily with reference to fluid guard ring PCells, the version management described herein may be applicable to any fluid PCells used in a circuit design.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. Additionally, the arrangement of the blocks in FIGS. 1 to 4 do not necessarily imply a particular order or sequence of events, nor are they intended to exclude other possibilities. For example, the operations depicted at blocks 120 and 130 may occur in any order or substantially simultaneously with each other. Such implementation details are immaterial to the operation of the present invention unless otherwise noted above.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

We claim:

1. A method for using a processor for version management for fluid guard ring PCells in a circuit design, the method comprising:
    upon saving the circuit design, identifying each instance of a fluid guard ring PCell in the design;
    for each instance of a fluid guard ring PCell in the design:
        identifying a version management parameter associated with the instance, and
        for an instance having an associated version management parameter not equal to zero, generating a hash code from a plurality of parameters associated with the instance and saving a cellview for the instance to a memory device, the saved cellview identifiable by the generated hash code, using a processor.

2. The method of claim 1, further comprising:
    upon editing an instance of a fluid guard ring PCell, updating the version management parameter associated with the instance to identify a current version of PCell source code.

3. The method of claim 1, further comprising setting the version management parameter associated with an instance to zero to turn off version control for that instance.

4. The method of claim 1, further comprising:
    receiving at the processor a command to evaluate the circuit design;
    identifying each instance of a fluid guard ring PCell in the design;
    for each instance of a fluid guard ring PCell in the design having an associated version management parameter not equal to zero:
        generating a hash code from a plurality of parameters associated with the instance;
        identifying a cellview of the instance saved in the memory device, the cellview identifiable by the generated hash code;
        copying the saved cellview to a sub-master for the instance; and
        evaluating the instance using the copied cellview in the sub-master.

5. The method of claim 4, further comprising: for each instance of a fluid guard ring PCell missing an associated version management parameter, evaluating the instance using a current version of PCell source code.

6. The method of claim 4, further comprising: for each instance of a fluid guard ring PCell having an associated version management parameter equal to zero, evaluating the instance using a current version of PCell source code.

7. The method of claim 4, further comprising: for each instance of a fluid guard ring PCell having an associated version management parameter equal to a current version of PCell source code, evaluating the instance using the current version of PCell source code.

8. The method of claim 4, further comprising: if a cellview cannot be found in the memory device, generating an PCell evaluation failure notice.

9. The method of claim 1, further comprising:
    receiving at the processor a command to copy the circuit design to a new design library;
    identifying each instance of a fluid guard ring PCell in the design;
    for each instance of a fluid guard ring PCell in the design having an associated version management parameter not equal to zero:
        generating a hash code from a plurality of parameters associated with the instance;
        identifying a cellview of the instance saved in the memory device, the cellview identifiable by the generated hash code;
        copying the saved cellview to the new design library; and
        updating a library parameter associated with the instance to identify the new design library.

10. A non-transitory computer readable medium storing instructions that when executed by a processor perform a method comprising:
    upon saving a circuit design, identifying each instance of a fluid guard ring PCell in the design;
    for each instance of a fluid guard ring PCell in the design:
        identifying a version management parameter associated with the instance, and
        for an instance having an associated version management parameter not equal to zero, generating a hash code from a plurality of parameters associated with the instance, and saving a cellview for the instance to a memory device, the saved cellview identifiable by the generated hash code, using a processor.

11. The non-transitory computer readable medium of claim 10, wherein upon editing an instance of a fluid guard ring PCell, the version management parameter associated with the instance is updated to identify the current version of the PCell source code.

12. The non-transitory computer readable medium of claim 10, wherein to turn off version control for an instance of a fluid guard ring PCell, the version management parameter associated with the instance is set to zero.

13. The non-transitory computer readable medium of claim 10, wherein upon receiving at the processor a command to evaluate the circuit design:
    each instance of a fluid guard ring PCell in the design is identified and for each instance with an associated version management parameter not equal to zero:
        a hash code is generated from a plurality of parameters associated with the instance;
        a cellview of the instance saved in the memory device is identified, the cellview identifiable by the generated hash code;
        the saved cellview is copied to a sub-master for the instance; and
        the instance is evaluated using the copied cellview in the sub-master.

14. The non-transitory computer readable medium of claim 10, wherein upon receiving at the processor a command to copy the circuit design to a new design library:

each instance of a fluid guard ring PCell in the design is identified and for each instance with an associated version management parameter not equal to zero:
- a hash code is generated from a plurality of parameters associated with the instance;
- a cellview of the instance saved in the memory device is identified, the cellview identifiable by the generated hash code;
- the saved cellview is copied to the new design library; and
- a library parameter associated with the instance is updated to identify the new design library.

15. A system comprising:
a memory to store a circuit design;
a processor configured to:
- identify each instance of a fluid guard ring PCell in the design upon saving the circuit design;
- for each instance of a fluid guard ring PCell in the design, identify a version management parameter associated with the instance, and
- for an instance having an associated version management parameter not equal to zero, generating a hash code from a plurality of parameters associated with the instance and saving a cellview for the instance to the memory, the saved cellview identifiable by the generated hash code.

16. The system of claim 15, wherein the processor is further configured to update the version management parameter associated with an instance of a fluid guard ring PCell to identify the current version of the PCell source code upon editing the instance.

17. The system of claim 15, wherein the processor is further configured to set the version management parameter associated with an instance of a fluid guard ring PCell to zero to turn off version control for that instance.

18. The system of claim 15, wherein upon receiving at the processor a command to evaluate the circuit design, the processor is further configured to:
- identify each instance of a fluid guard ring PCell in the design;
- for each instance of a fluid guard ring PCell in the design having an associated version management parameter not equal to zero:
  - generate a hash code from a plurality of parameters associated with the instance;
  - identify a cellview of the instance saved in the memory, the cellview identifiable by the generated hash code;
  - copy the saved cellview to a sub-master for the instance; and
  - evaluate the instance using the copied cellview in the sub-master.

19. The system of claim 15, wherein upon receiving a command to copy the circuit design to a new design library, the processor is further configured to:
- identify each instance of a fluid guard ring PCell in the design;
- for each instance of a fluid guard ring PCell in the design having an associated version management parameter not equal to zero:
  - generate a hash code from a plurality of parameters of the instance;
  - identify a cellview of the instance saved in the memory device, the cellview identifiable by the generated hash code;
  - copy the saved cellview to the new design library; and
  - update a library parameter associated with the instance to identify the new design library.

* * * * *